United States Patent
Lee et al.

(10) Patent No.: US 7,904,790 B2
(45) Date of Patent: Mar. 8, 2011

(54) FLASH MEMORY DEVICE ERROR CORRECTION CODE CONTROLLERS AND RELATED METHODS AND MEMORY SYSTEMS

(75) Inventors: Chang-Duck Lee, Seoul (KR); Seok-won Heo, Seoul (KR); Si-Yung Park, Seoul (KR); Dong-Ryoul Lee, Incheon (KR)

(73) Assignee: Samsung Electronics Co., Ltd. (KR)

( * ) Notice: Subject to any disclaimer, the term of this patent is extended or adjusted under 35 U.S.C. 154(b) by 1013 days.

(21) Appl. No.: 11/692,992

(22) Filed: Mar. 29, 2007

(65) Prior Publication Data

US 2008/0168319 A1 Jul. 10, 2008

(30) Foreign Application Priority Data

Jan. 8, 2007 (KR) ................. 10-2007-0002090

(51) Int. Cl.
*G11C 29/00* (2006.01)
(52) U.S. Cl. .................................. 714/763; 714/758
(58) Field of Classification Search .................. 714/763, 714/758, 785; 365/185.09
See application file for complete search history.

(56) References Cited

U.S. PATENT DOCUMENTS

| | | | |
|---|---|---|---|
| 5,475,693 A | 12/1995 | Christopherson et al. | |
| 6,041,001 A * | 3/2000 | Estakhri | 365/200 |
| 6,134,143 A * | 10/2000 | Norman | 365/185.09 |
| 6,256,762 B1 * | 7/2001 | Beppu | 714/763 |
| 6,651,212 B1 * | 11/2003 | Katayama et al. | 714/763 |
| 6,684,353 B1 | 1/2004 | Parker et al. | |
| 6,769,087 B2 * | 7/2004 | Moro et al. | 714/763 |
| 7,114,117 B2 * | 9/2006 | Tamura et al. | 714/763 |
| 7,747,927 B2 * | 6/2010 | Guterman et al. | 714/768 |
| 2004/0255225 A1 * | 12/2004 | Takai | 714/763 |
| 2006/0005109 A1 | 1/2006 | Marelli et al. | |

FOREIGN PATENT DOCUMENTS

| | | |
|---|---|---|
| JP | 10-312340 | 11/1998 |
| JP | 2005-285270 | 10/2005 |
| KR | 1020040038711 A | 5/2004 |
| WO | WO 03/100791 | 12/2003 |

* cited by examiner

*Primary Examiner* — Esaw T Abraham
(74) *Attorney, Agent, or Firm* — Myers Bigel Sibley & Sajovec

(57) ABSTRACT

An ECC controller for a flash memory device storing M-bit data (M: a positive integer equal to or greater than 2) includes an encoder and a decoder. The encoder generates first ECC data for input data to be stored in the flash memory device using a first error correction scheme and generates second ECC data for the input data using a second error correction scheme. The input data, the first ECC data, and the second ECC data are stored in the flash memory device. The decoder calculates the number of errors in data read from the flash memory device and corrects the errors in the read data using one of the first ECC data and the second ECC data selectively based on the number of the errors.

25 Claims, 5 Drawing Sheets

FLASH MEMORY DEVICE ERROR CORRECTION CODE CONTROLLERS AND RELATED METHODS AND MEMORY SYSTEMS

CROSS-REFERENCE TO RELATED APPLICATION

This U.S. non-provisional patent application claims priority under 35 U.S.C. §119 to Korean Patent Application No. 10-2007-02090, filed on Jan. 8, 2007, which is hereby incorporated by reference herein as if set forth in its entirety.

BACKGROUND

The present invention relates to flash memory devices and, more particularly, to methods and systems for detecting and correcting errors in multi-bit data stored in flash memory devices.

Nonvolatile memory devices are memory devices that can retain data even when power is not supplied to the device. Flash memory devices are one type of nonvolatile memory device. Although flash memory devices tend to be slower than the dynamic random access memory (DRAM) devices that are typically used as the main memory of personal computers (PC), flash memory devices may be faster and more robust against impact than hard disk memory storage devices. Because of these characteristics, flash memory devices are widely used as storage units in battery-operated storage devices.

Flash memory devices are electrically erasable and programmable. Thus, unlike electrically erasable programmable read only memory (EEPROM) devices, flash memory devices can be erased and programmed on a block-by-block basis. Because flash memory devices are less expensive than EEPROM devices, they are widely used for high-capacity solid-state nonvolatile storage in products such as, for example, digital music players, digital cameras and cellular phones. Flash memory devices are also used in universal serial bus (USB) drives that are widely used to store data and to transfer data between computers.

Flash memory devices store data in one or more cell arrays. Each cell in the array includes a floating gate transistor that stores one bit of data. Multi-level cell (MLC) flash memory devices that can store more than 1-bit of data per cell are also known in the art. MLC flash memory devices store more than 1 bit of data per cell by controlling the amount of electric charge accumulated in the floating gate of each cell. Herein, flash memory devices that store 1-bit of data per memory cell are called single-level cell or "SLC" flash memory devices and flash memory devices that store M-bits of data (where M is a positive integer that is greater than or equal to 2) per memory cell are called MLC flash memory devices.

With SLC flash memory devices, the data stored in a memory cell can be determined using a reference voltage that is between the threshold voltage distribution of data '1' and the threshold voltage distribution of data '0' (see FIG. 1A). For example, the data '1' or '0' can be determined based on whether or not a current flows through the memory cell when the reference voltage is applied to a control gate of the memory cell. Such a scheme can be similarly applied to MLC flash memory devices. As illustrated in FIG. 1A, two threshold voltage distributions are used to store 1-bit data in a memory cell. In contrast, as illustrated in FIGS. 1B and 1C, $2^M$ threshold voltage distributions are used to store M-bit data in a memory cell of an MLC flash memory device. For example, four threshold voltage distributions are used to store 2-bit data in a memory cell (FIG. 1B), eight threshold voltage distributions are used to store 3-bit data in a memory cell (FIG. 1C), and sixteen threshold voltage distributions are used to store 4-bit data in a memory cell (not shown in the figures). Thus, as the number of bits of data stored in a memory cell increases, the number of threshold voltage distributions used likewise increases.

However, the threshold voltage of a memory cell must be distributed within a predetermined voltage range, regardless of the number of bits of data stored in the memory cell. For this reason, as the number of threshold voltage distributions used increases, adjacent threshold voltage distributions may overlap each other as illustrated in FIGS. 1B and 1C. The amount of overlap generally increases as the number of bits of data stored in a memory cell increases. The amount of overlap may also be affected by a variety of factors such as charge loss, time elapse, temperature increase, coupling generated when adjacent cells are programmed, read operations on adjacent cells and/or cell failure. When adjacent threshold voltage distributions overlap, read data may contain many errors.

SUMMARY

Some embodiments of the present invention may provide error correction schemes for enhancing the reliability of multi-bit data read from a flash memory device.

Pursuant to some embodiments of the present invention, ECC controllers for a flash memory device storing M-bit data, M being a positive integer equal to or greater than 2 are provided. These ECC controllers may include an encoder that is configured to generate first ECC data in response to input data that is to be stored in the flash memory device using a first error correction scheme and that is configured to generate second ECC data in response to the input data using a second error correction scheme. The input data, the first ECC data, and the second ECC data are stored in the flash memory device. The ECC controllers may further include a decoder that is configured to calculate the number of errors in data read from the flash memory device and to correct the errors in the read data using one of the first ECC data and the second ECC data selectively according to the number of the errors.

In some embodiments, the encoder includes a first encoder that is configured to generate the first ECC data using the first error correction scheme and a second encoder that is configured to generate the second ECC data using the second error correction scheme. In some embodiments, the decoder includes: a first decoder that is configured to correct the errors in the read data using the first ECC data contained in the read data; a second decoder that is configured to correct the errors in the read data using the second ECC data contained in the read data; and a decoding controller that is configured to calculate the number of errors in the read data and that is further configured to control one of the first decoder and the second decoder to correct the errors in the read data selectively based on the number of the errors.

In further embodiments, if the number of errors in the read data is 3 or less, the decoding controller controls the first decoder to correct the errors in the read data; and if the number of errors in the read data is 4 or more, the decoding controller controls the second decoder to correct the errors in the read data. In still further embodiments, the first error correction scheme operates at a higher speed than the second error correction-scheme, and the second error correction scheme is capable of correcting a greater number of errors than the first error correction scheme. In some embodiments, the first error correction scheme may be an error correction scheme using a BCH code, and the second error correction scheme may be an error correction scheme using an RS code.

In still further embodiments, the flash memory device includes a data area and a spare area, the input data is stored in the data area, and the first ECC data and the second ECC data are stored in the spare area. In such embodiments, each of the memory cells in the data area may store M-bit data, and each of the memory cells in the spare area may store 1-bit data. The flash memory device may, for example, comprise a NAND flash memory device, a NOR flash memory device, a PRAM device or an MRAM device.

In other embodiments of the present invention, memory systems include a flash memory device for storing M-bit data, M being a positive integer equal to or greater than 2 and a memory controller that is configured to control the flash memory device. The memory controller includes an encoder that is configured to generate first ECC data for input data to be stored in the flash memory device using a first error correction scheme and second ECC data for the input data using a second error correction scheme, the input data, the first ECC data, and the second ECC data being stored in the flash memory device. A decoder may be provided that is configured to calculate the number of errors in data read from the flash memory device and to correct the errors in the read data using one of the first ECC data and the second ECC data selectively according to the number of the errors.

In some embodiments, the encoder includes a first encoder that is configured to generate the first ECC data using the first error correction scheme and a second encoder that is configured to generate the second ECC data using the second error correction scheme.

In other embodiments, the decoder includes a first decoder that is configured to correct errors in the read data using first ECC data contained in the read data, a second decoder that is configured to correct errors in the read data using second ECC data contained in the read data and a decoding controller that is configured to calculate the number of errors in the read data and to control one of the first decoder and the second decoder to correct the errors in the read data selectively according to the number of the errors.

In further embodiments of the present invention, methods for correcting errors in M-bit data, M being a positive integer equal to or greater than 2. The methods may include generating first ECC data for input data to be stored in the flash memory device by using a first error correction scheme; generating second ECC data for the input data by using a second error correction scheme; storing the input data, the first ECC data, and the second ECC in the flash memory device; calculating the number of errors in data read from the flash memory device; and correcting the errors in the read data using one of the first ECC data and the second ECC data selectively according to the number of the errors.

In some embodiments, the correcting of the errors in the read data includes: correcting the errors in the read data by using the first ECC data if the number of the errors in the read data is 3 or less; and correcting the errors in the read data by using the second ECC data if the number of the errors in the read data is 4 or more.

In still further embodiments of the present invention, methods for correcting data errors are provided in which first data that is to be stored in a flash memory device is received. First error correction code (ECC) data is generated for the first data using a first error correction scheme, and second error correction code (ECC) data is generated for the first data using a second error correction scheme. The first data, the first ECC data, and the second ECC is stored in the flash memory device, and thereafter the first data is read from the flash memory device. The number of errors in the read first data is then determined, and the errors in the first data are corrected using one of the first ECC data or the second ECC data selectively based on the determined number of the errors.

BRIEF DESCRIPTION OF THE FIGURES

The accompanying figures are included to provide a further understanding of the present invention, and are incorporated in and constitute a part of this specification. The drawings illustrate embodiments of the present invention and, together with the description, serve to explain principles of the present invention. In the figures.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1A:
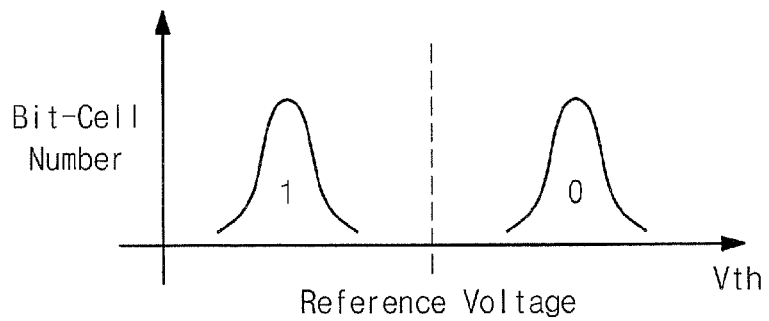
FIG. 1A is a graph illustrating the threshold voltage distributions of a flash memory cell that stores 1-bit data.
Figure 1B:
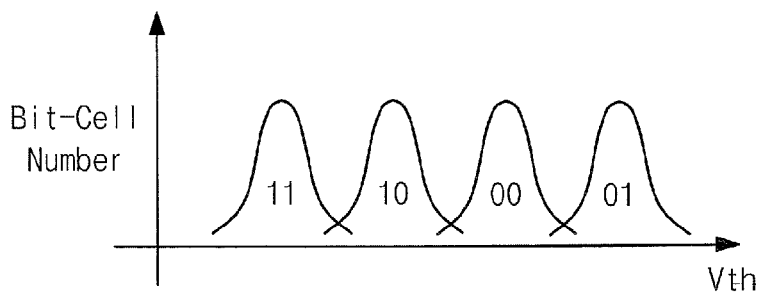
FIG. 1B is a graph illustrating the threshold voltage distributions of a flash memory cell that stores 2-bit data.
Figure 1C:
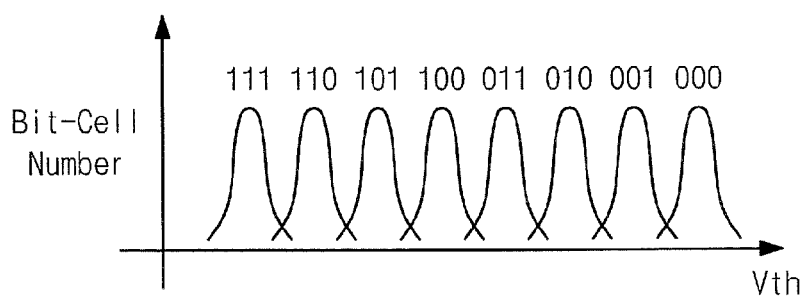
FIG. 1C is a graph illustrating the threshold voltage distributions of a flash memory cell that stores 3-bit data.
Figure 2:
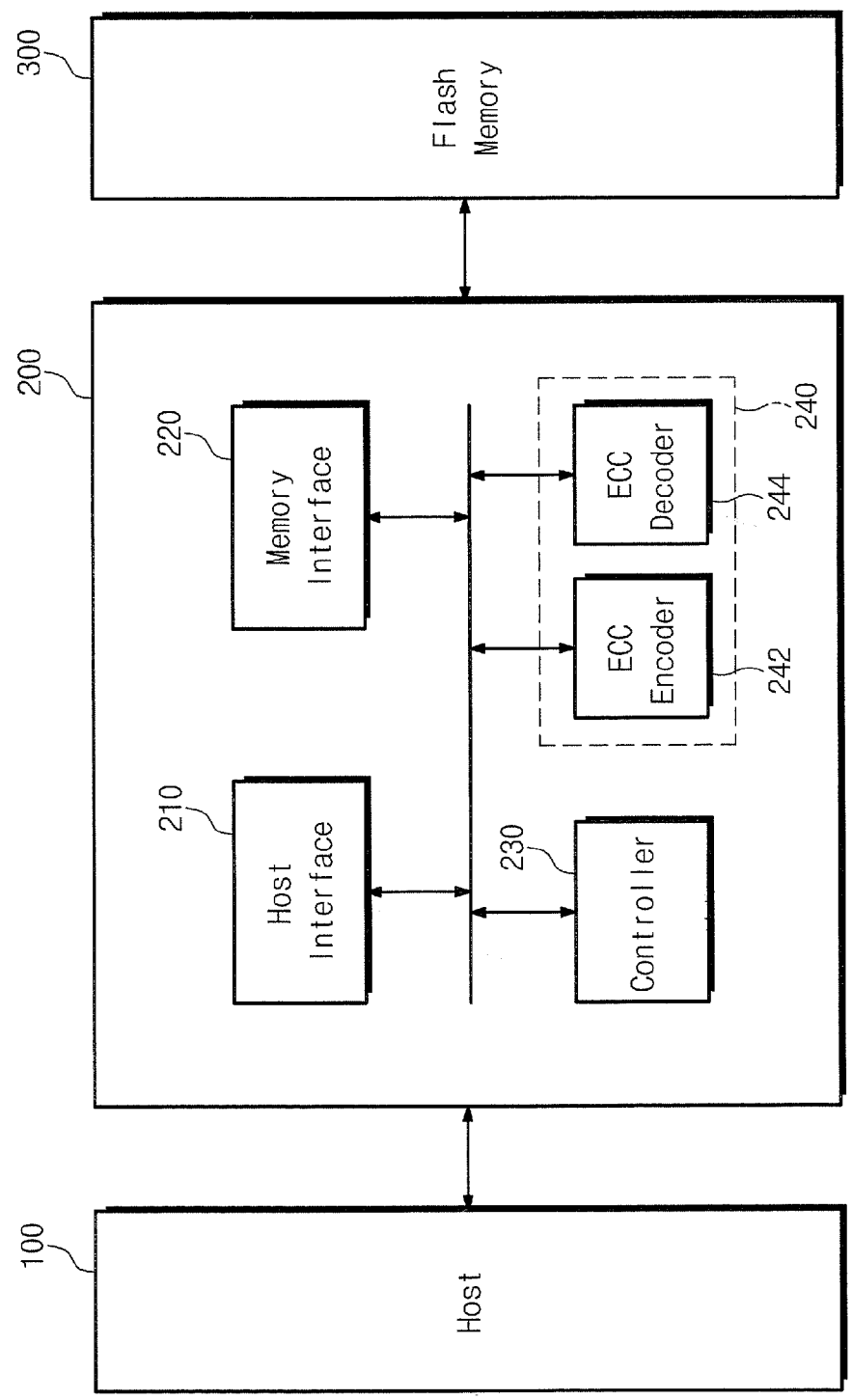
FIG. 2 is a block diagram of a memory system according to embodiments of the present invention.

FIG. 2 is a block diagram of a memory system according to embodiments of the present invention. As shown in FIG. 2, the memory system includes a memory controller 200 and a flash memory device 300. The flash memory device 300 operates under the control of the memory controller 200. The flash memory device 300 is configured to store M-bit data (e.g., 2-bit data, 3-bit data, 4-bit data, etc.) in each cell of its memory cell array. The flash memory device 300 may be implemented as, for example, a NAND flash memory device, a NOR flash memory device, a phase change random access memory (PRAM) device, a magnetic random access memory (MRAM) device or another nonvolatile memory device.

The memory controller 200 controls the flash memory device 300 under the control of a host 100. The memory controller 200 includes a host interface 210, a memory interface 220, a controller 230 and an error correction code (ECC) controller 240. The host interface 210 provides an interface with the host 100, and the memory interface 220 provides an interface with the flash memory device 300. The controller 230 may be implemented, for example, as a processor that controls the overall operation of the memory controller 200. The host 100 and the memory controller 200 may communicate with each other through any of a variety of communication interfaces such as a Peripheral Component Interconnect (PCI) and/or a universal serial bus (USB).

The memory controller 200 and the flash memory device 300 may communicate with each other through a well-known NAND/NOR interface scheme. The memory system including the memory controller 200 and the flash memory device 300 may, for example, be a memory card such as a flash memory card or a smart card.

The ECC controller 240 is configured to generate ECC data for data that is to be stored in the flash memory device 300. The ECC data is used for error detection and/or correction. The ECC controller 240 performs an error detection/correction operation on data that is read from the flash memory device 300. According to an embodiment of the present invention, the ECC controller 240 generates first ECC data using a first error correction scheme and generates second ECC data using a second error correction scheme. In addition, the ECC controller 240 detects errors in data read from the flash memory device 300 and corrects the detected errors using one of the first ECC data and the second ECC data selectively according to the number of the detected errors.

In certain embodiments of the present invention, the ECC controller 240 may include an ECC encoder 242 and an ECC decoder 244. The ECC encoder 242 generates the first ECC data using a first error correction scheme and generates the second ECC data using a second error correction scheme. The ECC decoder 244 detects errors in data read from the flash memory device 300 and corrects the detected errors using one of the first ECC data and the second ECC data selectively based on the number of errors detected. The first error correction scheme may, for example, be a high-speed error correction scheme that can support an on-the-fly function. The second error correction scheme may, for example, be a high-performance error correction scheme that can correct a larger number of errors in the read data.

For example, in some embodiments, if the number of the detected errors is 3 or less, the ECC controller 240 rapidly corrects the detected errors using the first ECC data, and if the number of the detected errors is 4 or more, the ECC controller 240 accurately corrects the detected errors using the second ECC data. That is, if the number of detected errors is small, the ECC controller 240 makes a rapid error correction, and if the number of the detected errors is large, the ECC controller 240 makes an accurate error correction, though rather slowly.

As described above, the ECC controller 240 is configured to correct errors in the read data using either the high-speed error correction scheme or the high-performance error correction scheme depending on the number of detected errors. This makes it possible to read multi-bit data more accurately.

Figure 3:
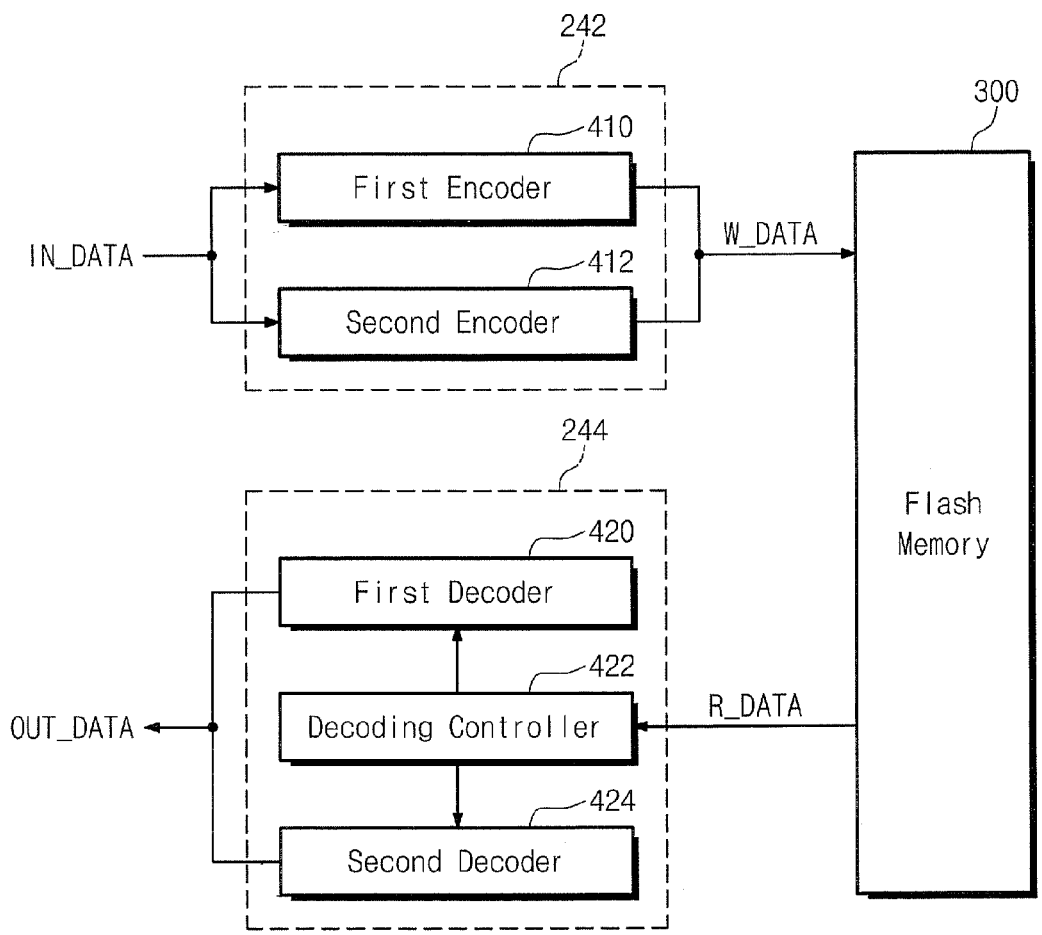
FIG. 3 is a block diagram of an embodiment of the ECC controller illustrated in FIG. 2.

FIG. 3 is a block diagram of the ECC controller 240 illustrated in FIG. 2 according to embodiments of the present invention. As shown in FIG. 3, the ECC controller 240 may include an ECC encoder 242 and an ECC decoder 244. The ECC encoder 242 may include a first encoder 410 that performs an encoding operation suitable for the high-speed error correction scheme and a second encoder 412 that performs an encoding operation suitable for the high-performance error correction scheme. The first encoder 410 receives program data IN_DATA (i.e., the data that is to be written to the flash memory device) from the host 100 and generates first ECC data ECC1 corresponding to a Bose-Chaudhuri-Hocquenghem (BCH) code that is suitable for the high-speed error correction scheme. The second encoder 412 receives the program data IN_DATA and generates second ECC data ECC2 corresponding to Reed-Solomon (RS) code that is suitable for the high-performance error correction scheme. The BCH code and the RS code are merely exemplary, and other suitable codes such as, for example, a hamming code and/or a convolutional code, can also be used as the encoding codes.

The first ECC data ECC1 and the second ECC data ECC2 are associated with the program data IN_DATA and are then stored in the flash memory device 300 through the memory interface 220.

Figure 4:
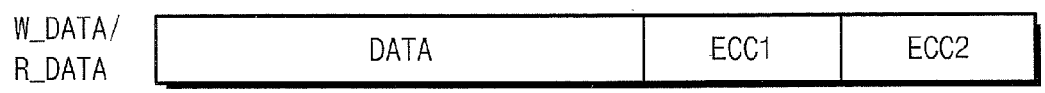
FIG. 4 is a diagram illustrating the format of data that is written to and/or read from a flash memory device according to embodiments of the present invention.

FIG. 4 is a diagram illustrating the format of write/read data W_DATA/R_DATA according to embodiments of the present invention that is stored/read in/from the flash memory device 300 illustrated in FIG. 3.

Although not illustrated in the drawings, the flash memory device 300 includes a memory cell array that may have at least two storage areas. Referring to FIG. 4, the data (DATA) that is received from the host 100 is stored in the first storage area of the memory cell array, which will be referred to as a main cell area. The ECC data (ECC1 and ECC2) that is related to the data stored in the main cell area is stored in a second storage area of the main cell array. This second storage area is referred to herein as a spare area. In some embodiments of the present invention, each of memory cells in the main cell area stores multi-bit data, while each of memory cells in the spare area stores single-bit data. In other embodiments, the main cell area may store both the data and the ECC data in a multi-bit state.

In general, errors in multi-bit data occur on a bit-by-bit basis. That is, a data error occurs due to an overlap between adjacent threshold voltage distributions. This means that errors in read data are not contagious.

Figure 5:
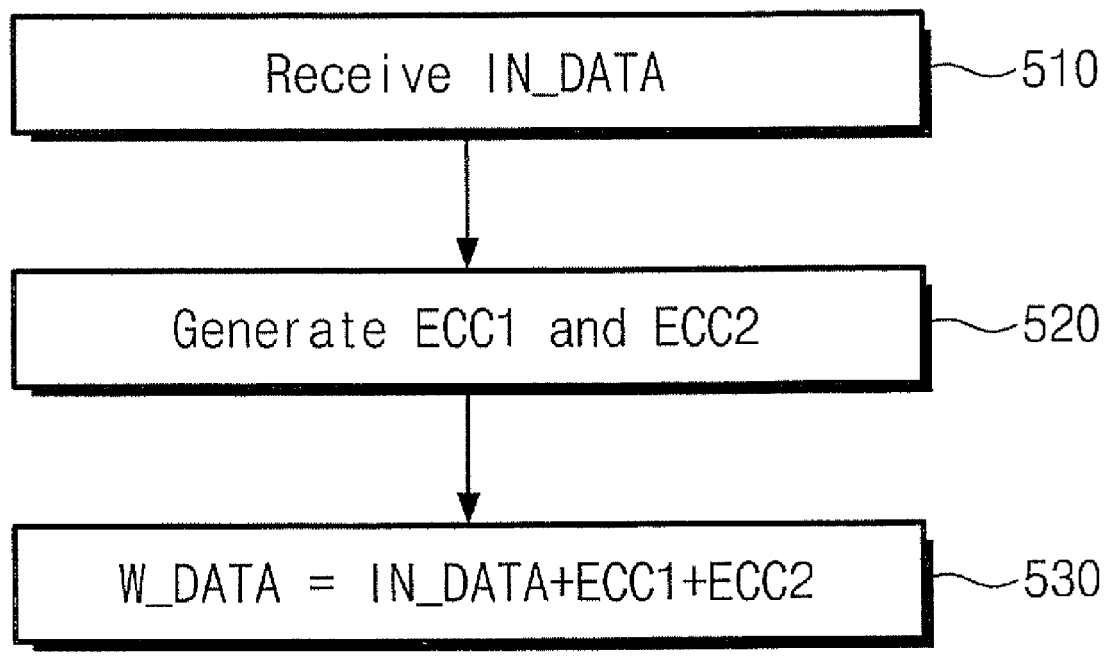
FIG. 5 is a flowchart illustrating an encoding operation of the ECC encoder illustrated in FIG. 3 according to embodiments of the present invention.

FIG. 5 is a flowchart illustrating an encoding operation of the ECC encoder 242 illustrated in FIG. 3.

Referring to FIGS. 3 and 5, the program data IN_DATA is in put to the first encoder 410 and the second encoder 412 of the ECC encoder 242 in operation 510. In operation 520, the first encoder 410 and the second encoder 412 generate the first ECC data ECC1 and the second ECC data ECC2, respectively. In operation 530, the ECC encoder 242 outputs write data W_DATA containing the program data IN_DATA, the first ECC data ECC1, and the second ECC data ECC2.

Referring again to FIG. 3, the ECC decoder 244 includes a first decoder 420, a decoding controller 422, and a second decoder 424. Read data R_DATA read from the flash memory device 300 is provided to the ECC decoder 244. The ECC decoder 244 detects errors in the read data R_DATA and makes an error correction using one of the first decoder 420 and the second decoder 424 selectively according to the number of detected errors. For example, in some embodiments, if the number of the detected errors is 3 or less, the decoding controller 422 controls the first decoder 420 to make an error correction using the first ECC data ECC1 contained in the read data R_DATA. If the number of the detected errors is 4 or more, the decoding controller 422 controls the second decoder 424 to make an error correction using the second ECC data ECC2 contained in the read data R_DATA.

The first decoder 420 may make a high-speed error correction using the first ECC data ECC2 contained in the read data R_DATA. If the number of errors in the read data R_DATA is 3 or less, the error correction can be made rapidly because of the simplicity of the error location polynomial (ELP). The first decoder 420 supports an "on-the-fly" function for correcting errors in current read data R_DATA before the next read data from the flash memory device 300 is input thereto. Therefore, even when a plurality of read data R_DATA are successively input to the ECC decoder 244, additional time may not be required for the error correction. For a high-speed operation, an error correction scheme for the first decoder 420 may be implemented in hardware in some embodiments of the present invention.

The second decoder 424 may make a high-performance error correction using the second ECC data ECC1 contained in the read data R_DATA. If the number of errors in the read data R_DATA is 4 or more, an error correction scheme is more difficult to implement in hardware due to the complexity of the ELP. Therefore, the second decoder 424 may use a more powerful error correction scheme, even though rather more time is taken for the error correction. The high-performance error correction scheme using the RS code is robust against a burst error within the maximum correction length and corrects errors in an operation on a symbol-by-symbol basis. Therefore, such a high-performance error correction scheme may be suitable for error correction when the number of errors is large. In another embodiment, the second decoder 424 may perform a decoding operation using error correction software stored in a buffer memory (not illustrated) in the memory controller 200 illustrated in FIG. 2.

When the time taken for the error correction operation of the second decoder 424 is longer than an input period of the read data R_DATA, the decoding controller 424 may perform a control operation so that additional read data R_DATA is not received from the flash memory device 300 during the decoding operation of the second decoder 424.

Figure 6:
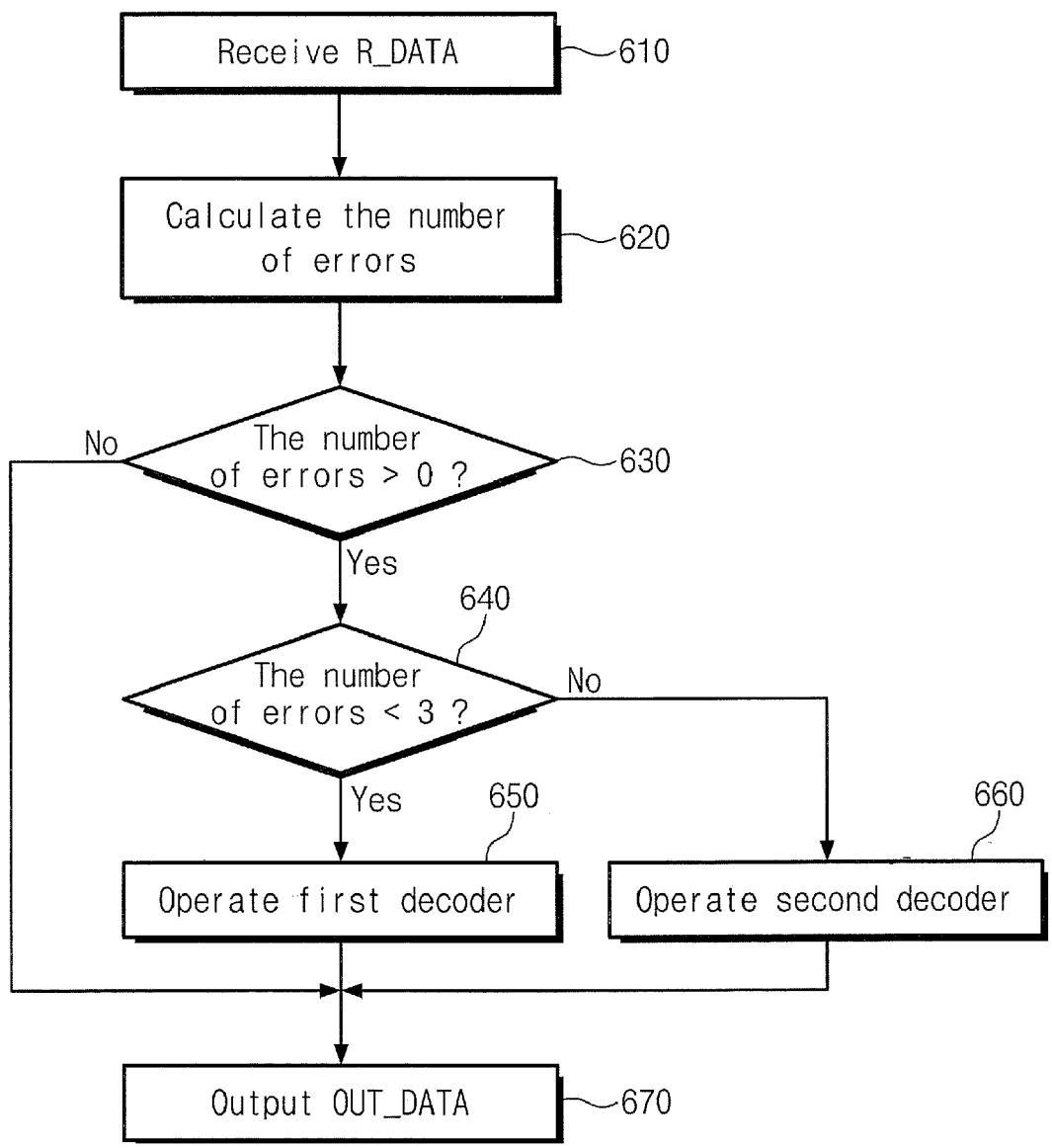
FIG. 6 is a flowchart illustrating a decoding operation of the ECC decoder illustrated in FIG. 3 according to embodiments of the present invention.

FIG. 6 is a flowchart illustrating a decoding operation of the ECC decoder 244 illustrated in FIG. 3 according to certain embodiments of the present invention. As shown in FIG. 6, the decoding controller 422 receives read data R_DATA from the flash memory device 300 in operation 610. In operation 620, the decoding controller 422 calculates the number of errors in the read data R_DATA by, for example, syndrome calculation. If no errors are detected (operation 630), the decoding controller 422 transfers the corresponding data through the host interface 210 to the host 100 (operation 670).

If the number of detected errors is, for example, 3 or less (in operation 640), the decoding controller 422 controls the first decoder 420 to make an error correction using the first ECC data ECC1 (in operation 650). If the number of the detected errors is, for example, 4 or more, the decoding controller 422 controls the second decoder 424 to make an error correction using the second ECC data ECC2 (in operation 660). The error-corrected data output from one of the first decoder 420 and the second decoder 424 is transferred through the host interface 210 to the host 100 (operation 670).

As described above, the dual error correction scheme including, for example, a high-speed error correction scheme and a high-performance error correction scheme may be used to store and read multi-bit data, thereby making it possible to accurately read the original multi-bit data.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An error correction code (ECC) controller for a flash memory device that stores M-bit data per memory cell, M being a positive integer equal to or greater than 2, the ECC controller comprising:

an encoder that is configured to generate first ECC data in response to input data that is input for storage in the flash memory device using a first error correction scheme and that is configured to generate second ECC data in response to the input data using a second error correction scheme; and a decoder that is configured to calculate the number of errors in data read from the flash memory device and to correct the errors in the read data using one of the first ECC data or the second ECC data selectively according to the number of the errors.

2. The ECC controller of claim 1, wherein the encoder comprises:

a first encoder that is configured to generate the first ECC data using the first error correction scheme; and a second encoder that is configured to generate the second ECC data using the second error correction scheme.

3. The ECC controller of claim 1, wherein the data read from the flash memory device comprises the read input data, the read first ECC data and the read second ECC data, and wherein the decoder comprises:

a first decoder that is configured to correct errors in the read data using the first ECC data contained in the read data;

a second decoder that is configured to correct errors in the read data using the second ECC data contained in the read data; and a decoding controller that is configured to calculate the number of errors in the read data and that is further configured to control one of the first decoder or the second decoder to correct the errors in the read data selectively based on the number of errors.

4. The ECC controller of claim 3, wherein if the number of errors in the read data is 3 or less, the decoding controller controls the first decoder to correct the errors in the read data; and if the number of errors in the read data is 4 or more, the decoding controller controls the second decoder to correct the errors in the read data.

5. The ECC controller of claim 1, wherein the first error correction scheme operates at a higher speed than the second error correction scheme, and wherein the second error correction scheme is configured for correcting a greater number of errors than the first error correction scheme.

6. The ECC controller of claim 1, wherein the first error correction scheme is an error correction scheme that uses a Bose-Chaudhuri-Hocquenghem (BCH) code, and the second error correction scheme is an error correction scheme that uses a Reed Solomon (RS) code.

7. The ECC controller of claim 1, wherein a memory cell array of the flash memory device includes a data area and a spare area, and wherein the input data is stored in the data area, and wherein the first ECC data and the second ECC data are stored in the spare area.

8. The ECC controller of claim 7, wherein each of the memory cells in the data area stores M-bit data, and wherein each of the memory cells in the spare area stores 1-bit data.

9. The ECC controller of claim 1, wherein the flash memory device is one of a NAND flash memory device, a NOR flash memory device, a phase change random access memory (PRAM) device or a magnetic random access memory (MRAM) device.

10. The ECC controller of claim 1, in combination with the flash memory device to form a memory system.

11. A method for correcting data errors, the method comprising:
receiving first data that is to be stored in a flash memory device;
generating first error correction code (ECC) data for the first data using a first error correction scheme;
generating second error correction code (ECC) data for the first data using a second error correction scheme;
storing the first data, the first ECC data, and the second ECC in the flash memory device;
reading the first data from the flash memory device;
determining the number of errors in the read first data; and
correcting the errors in the first data using one of the first ECC data or the second ECC data selectively based on the determined number of the errors.

12. The method of claim 11, wherein storing the first data in the flash memory device comprises storing the first data in a plurality of memory cells of the flash memory device, where multiple bits of the first data are stored in at least some of the plurality of memory cells.

13. The method of claim 12, wherein correcting the errors in the first data comprises:
correcting the errors in the first data using the first ECC data if the number of errors in the read first data is 3 or less; and
correcting the errors in the first data using the second ECC data if the number of errors in the read first data is 4 or more.

14. The method of claim 12, wherein the first error correction scheme operates at a higher speed than the second error correction scheme, and wherein the second error correction scheme is capable of correcting a greater number of errors than the first error correction scheme.

15. The method of claim 12, wherein the first error correction scheme is an error correction scheme that uses a Bose-Chaudhuri-Hocquenghem (BCH) code, and wherein the second error correction scheme is an error correction scheme that uses a Reed Solomon (RS) code.

16. The method of claim 12, wherein a memory cell array of the flash memory device includes a data area and a spare area, wherein the first data is stored in the data area, and wherein the first ECC data and the second ECC data are stored in the spare area.

17. The method of claim 16, wherein each of the memory cells in the data area stores M-bit data, and each of the memory cells in the spare area stores 1-bit data.

18. The method of claim 12, wherein the flash memory device is one of a NAND flash memory device, a NOR flash memory device, a phase change random access memory (PRAM) device or a magnetic random access memory (MRAM) device.

19. A memory system comprising:
a flash memory device that is configured to store M-bit data, M being a positive integer equal to or greater than 2; and
a memory controller that is configured to control the flash memory device, the memory controller comprising:
an encoder that is configured to generate first ECC data in response to input data that is input for storage in the flash memory device by using a first error correction scheme and that is configured to generate second ECC data in response to the input data by using a second error correction scheme, the input data, the first ECC data, and the second ECC data being stored in the flash memory device; and
a decoder that is configured to calculate the number of errors in data read from the flash memory device and to correct the errors in the read data using one of the first ECC data or the second ECC data selectively according to the number of errors.

20. The memory system of claim 19, wherein the encoder comprises:
a first encoder that is configured to generate the first ECC data in response to the input data by using the first error correction scheme; and
a second encoder that is configured to generate the second ECC data in response to the input data by using the second error correction scheme.

21. The memory system of claim 19, wherein the decoder comprises:
a first decoder that is configured to correct the errors in the read data using the first ECC data contained in the read data;
a second decoder that is configured to correct the errors in the read data using the second ECC data contained in the read data; and
a decoding controller that is configured to calculate the number of errors in the read data and that is further configured to control one of the first decoder or the second decoder to correct the errors in the read data selectively according to the number of errors.

22. The memory system of claim 19, wherein the first error correction scheme is a high-speed error correction scheme that supports an on-the-fly function, and the second error correction scheme is a high-performance error correction scheme that does not support the on-the-fly function.

23. The memory system of claim 19, wherein the first error correction scheme is an error correction scheme that uses a Bose-Chaudhuri-Hocquenghem (BCH) code, and the second error correction scheme is an error correction scheme that uses a Reed Solomon (RS) code.

24. The memory system of claim 19, wherein a memory cell array of the flash memory device includes a data area and a spare area, and wherein the input data is stored in the data area, and wherein the first ECC data and the second ECC data are stored in the spare area.

25. The memory system of claim 24, wherein each of memory cells in the data area stores M-bit data, and wherein each of memory cells in the spare area stores 1-bit data.

* * * * *